United States Patent [19]

Ochi et al.

[11] 4,175,268
[45] Nov. 20, 1979

[54] SOLID STATE COLOR CAMERA

[75] Inventors: Shigeyuki Ochi, Machida; Hiroshi Yamazaki, Ebina; Seisuke Yamanaka, Mitaka, all of Japan

[73] Assignee: Sony Corporation, Tokyo, Japan

[21] Appl. No.: 853,902

[22] Filed: Nov. 22, 1977

[30] Foreign Application Priority Data

Nov. 26, 1976 [JP] Japan .................... 51-142493

[51] Int. Cl.² ........................................ H04N 9/04
[52] U.S. Cl. .................................. 358/44; 358/46
[58] Field of Search ...................... 358/41, 44, 46

[56] References Cited

U.S. PATENT DOCUMENTS 4,042,956  8/1977  Yamanaka .................... 358/41

Primary Examiner—Robert L. Richardson

Attorney, Agent, or Firm—Hill, Van Santen, Steadman, Chiara & Simpson

[57] ABSTRACT

A solid state color camera having a charge coupled device (CCD) on which the image of an object to be picked up is projected. In the color camera, the frequency of a clock signal, which is supplied to a horizontal shift register of the CCD chip for reading out a stored image signal therein, is so selected that the carrier frequency of a chroma signal, which is read out at the output terminal of the horizontal shift register, coincides with the color sub-carrier frequency (3.58 MHz) of a standard color television signal (for example, NTSC color television signal), and also the order for reading out image informations stored in image sensing elements of the CCD chip arranged in both the horizontal and vertical directions is so selected so that an output signal can be derived from the horizontal shift register with the same phase as that of the color sub-carrier of the standard color television signal.

10 Claims, 42 Drawing Figures

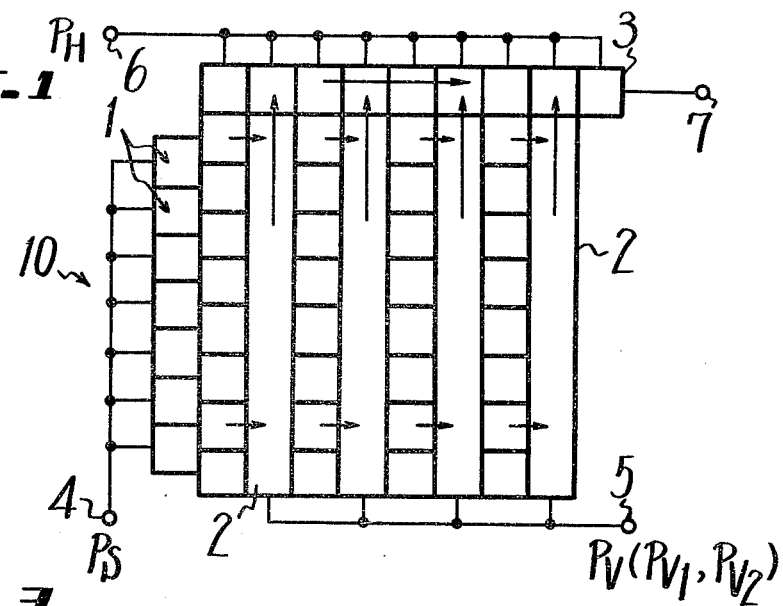
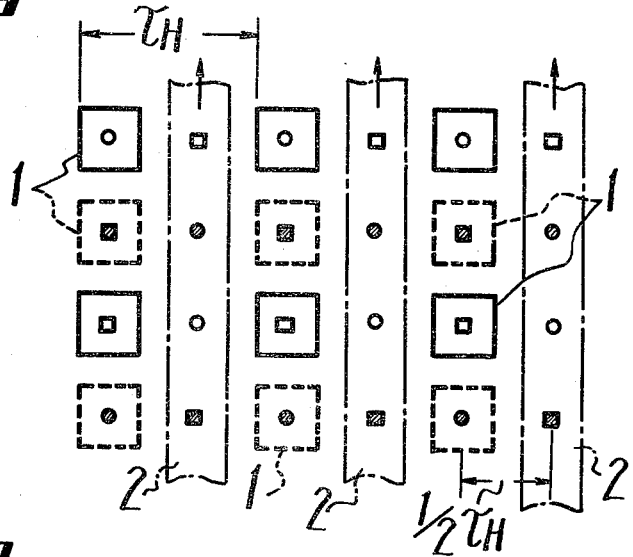
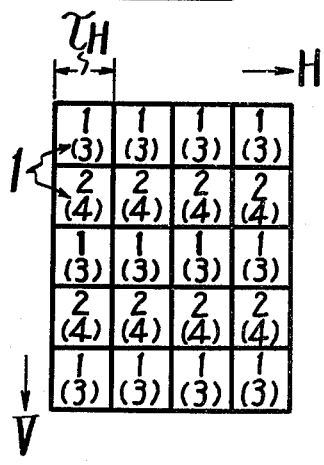
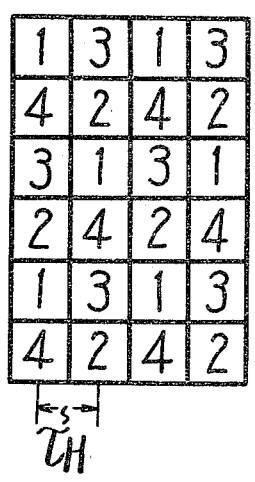
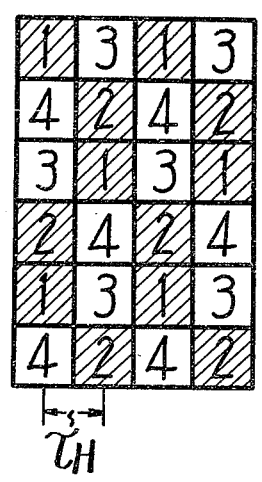

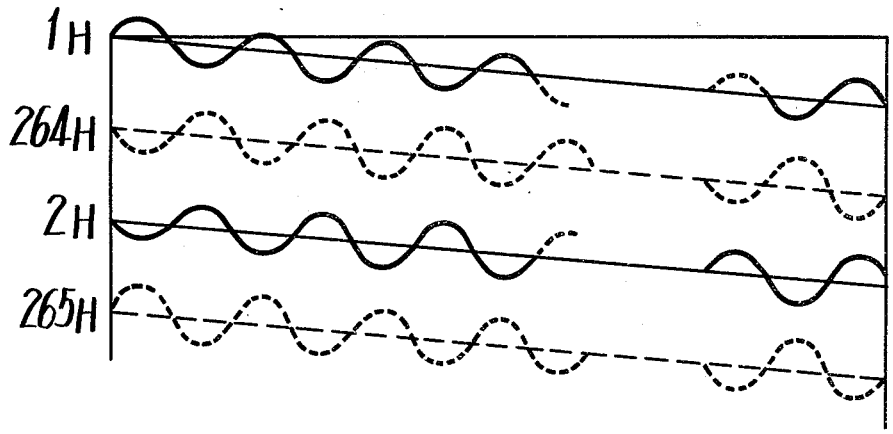
Fig. 2A 1st Frame
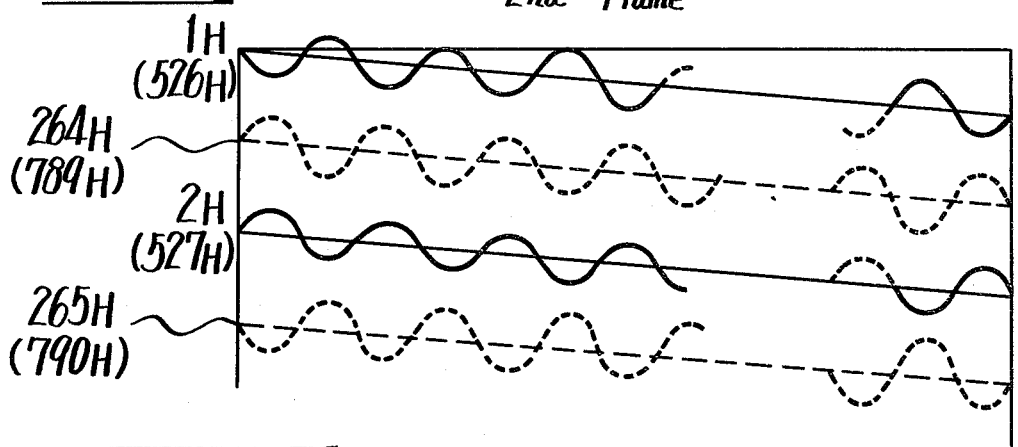
Fig. 2B 2nd Frame
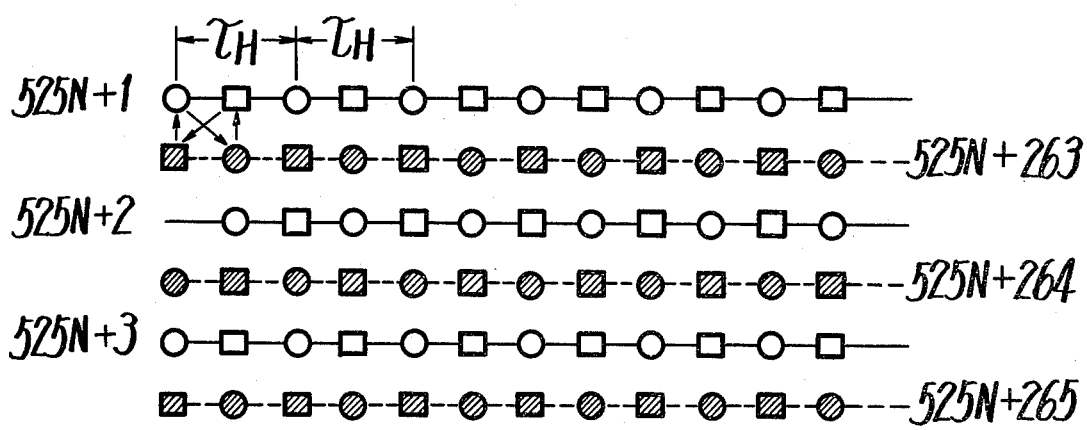
Fig. 2C
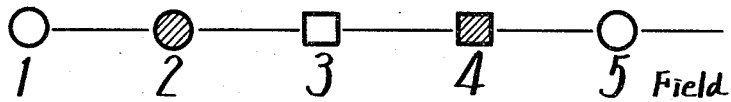
Fig. 2D

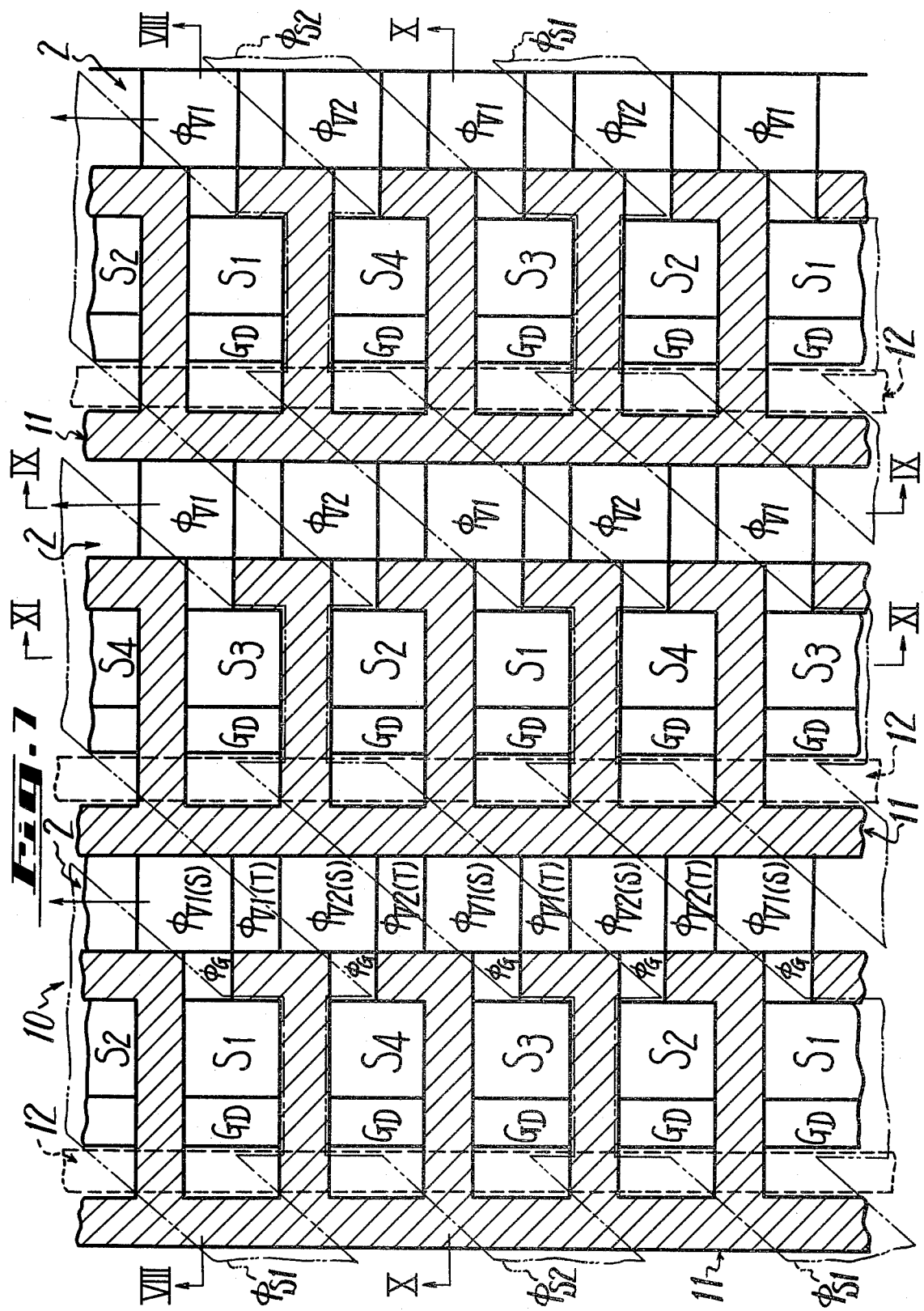

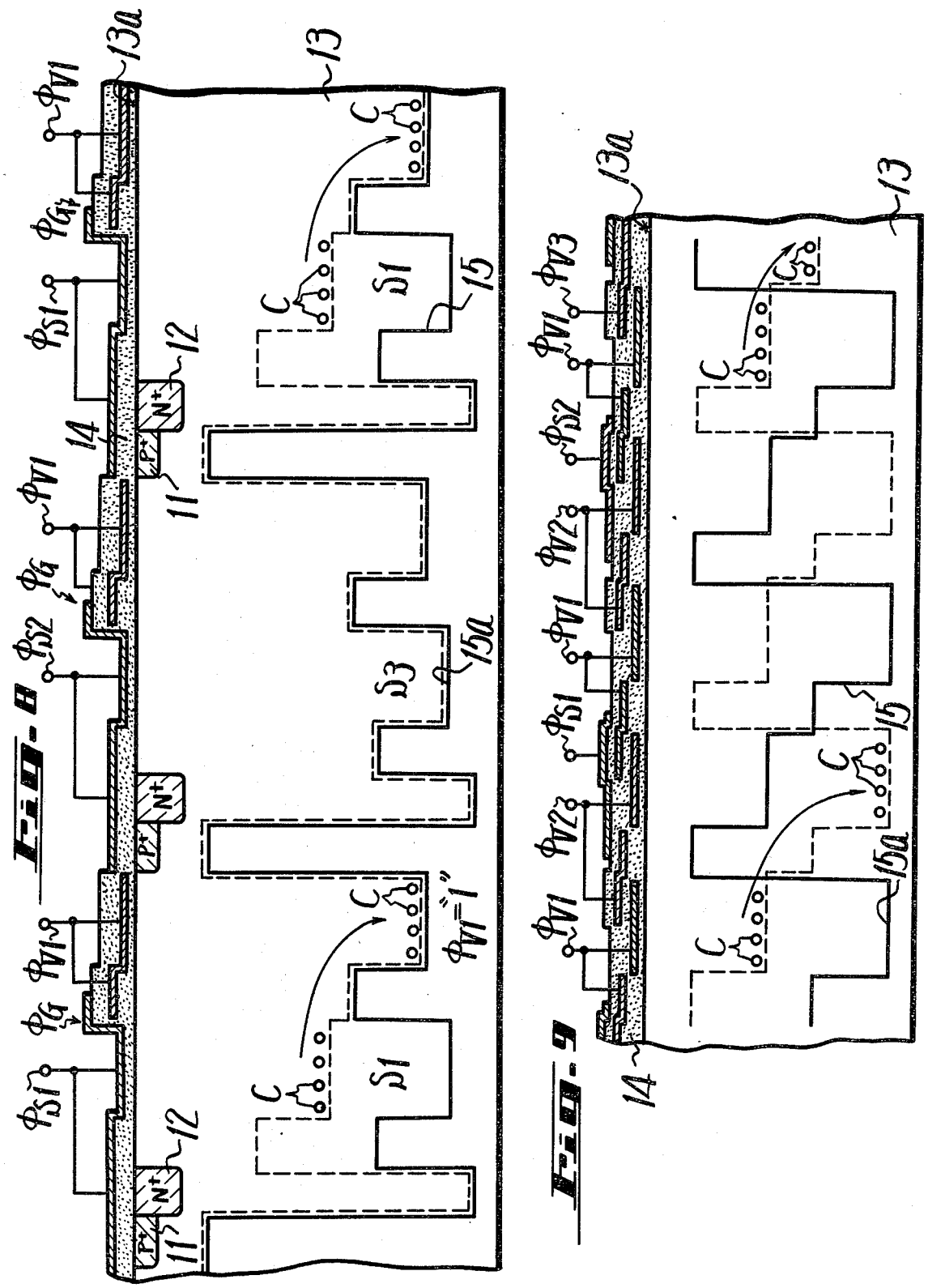

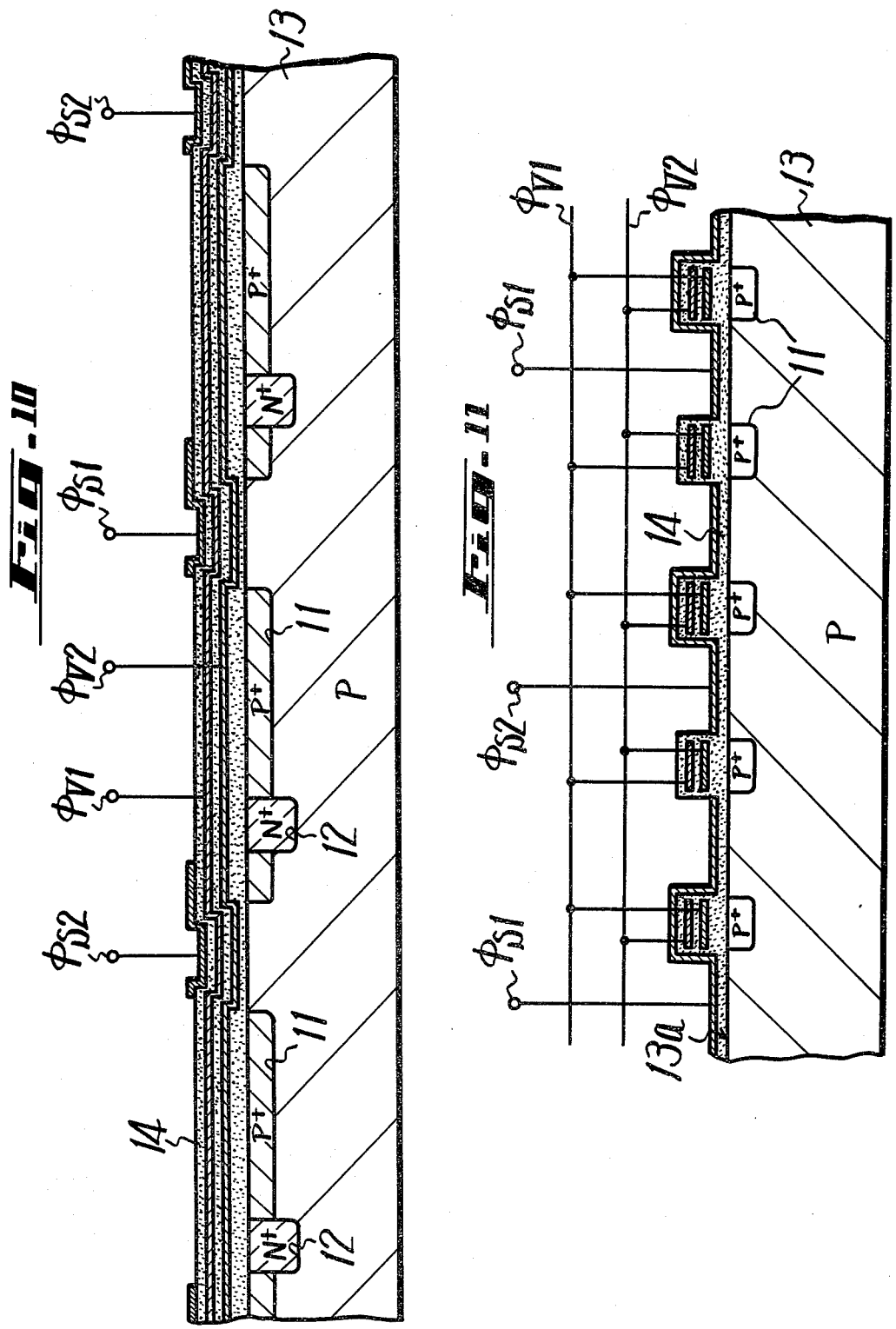

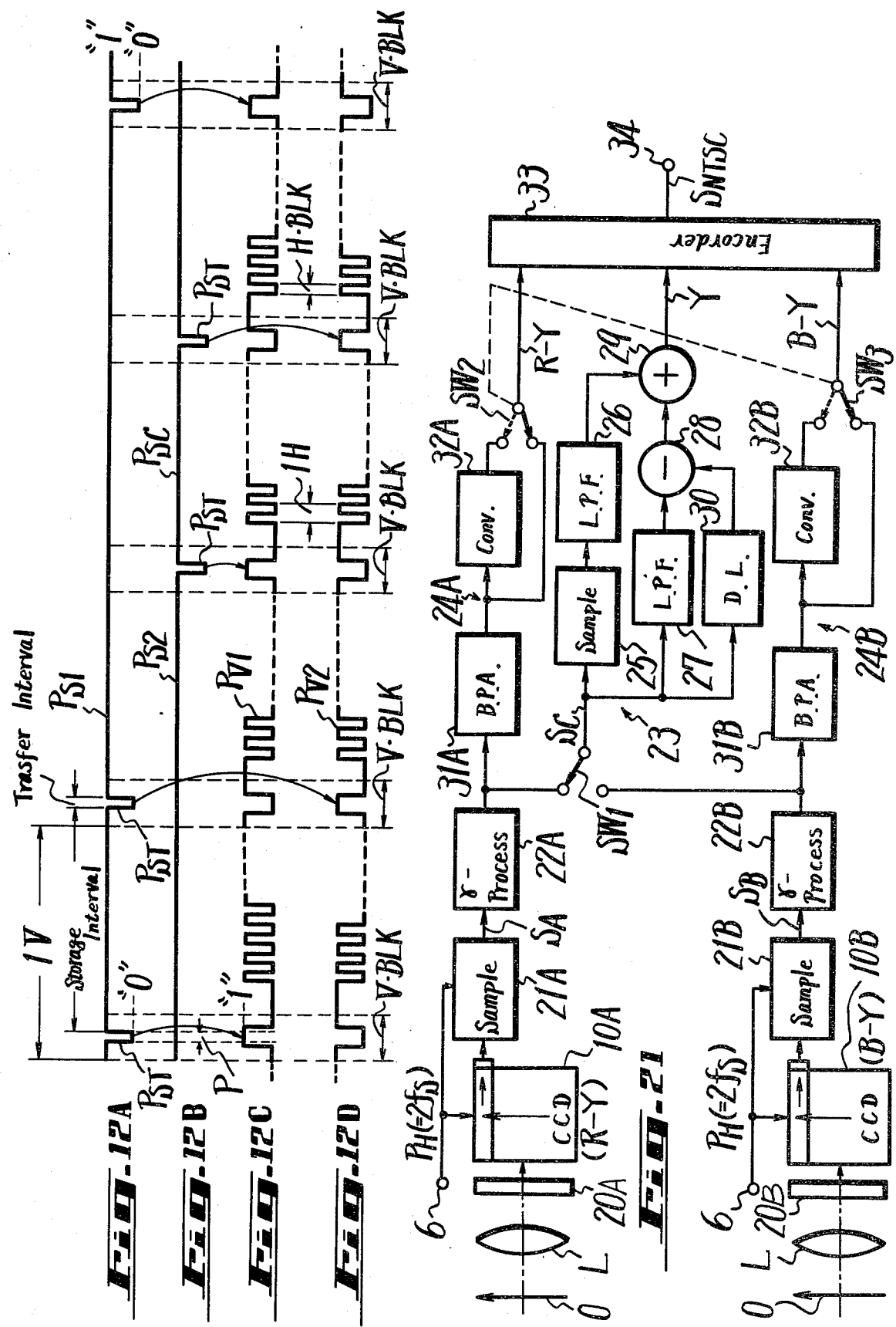

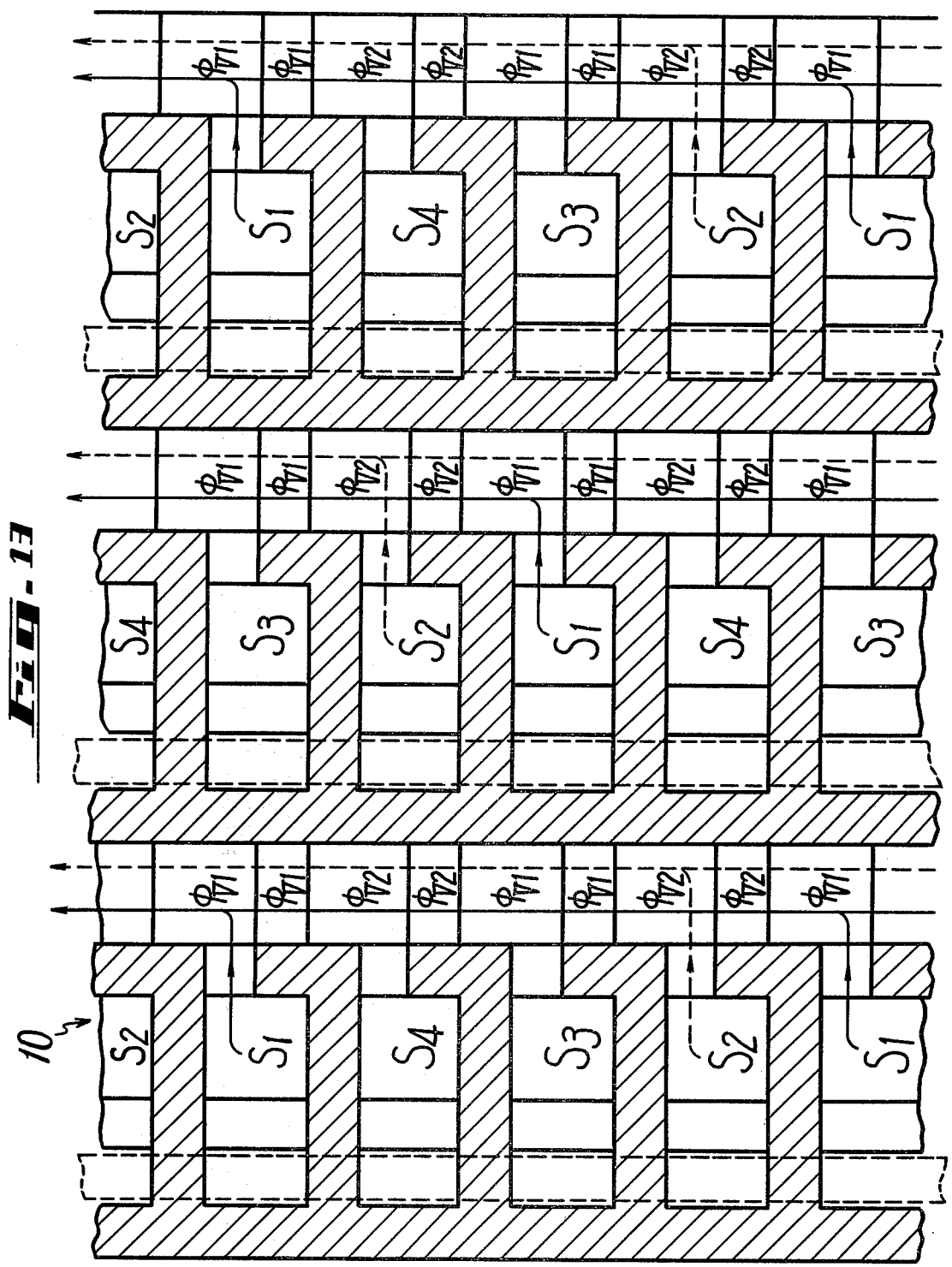

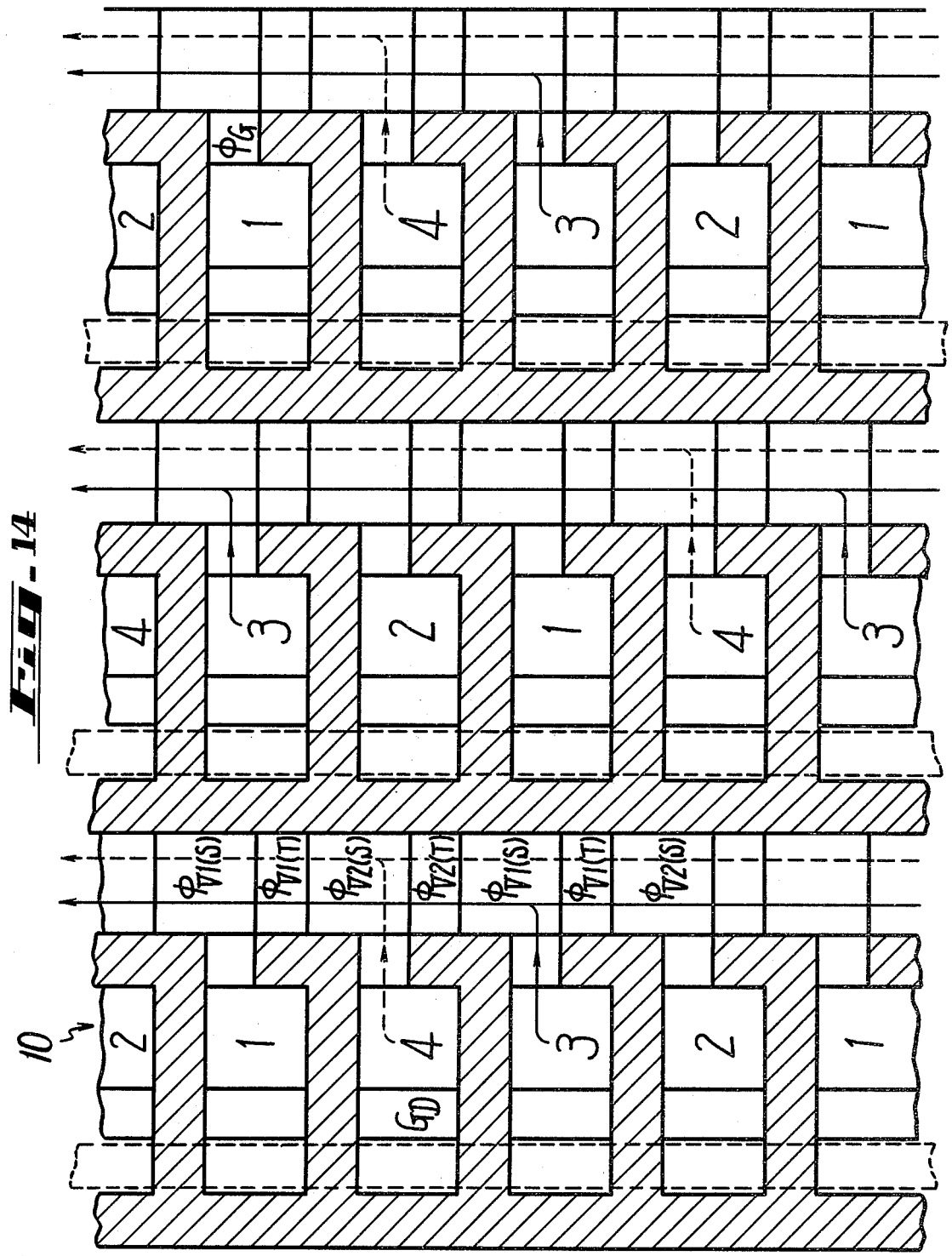

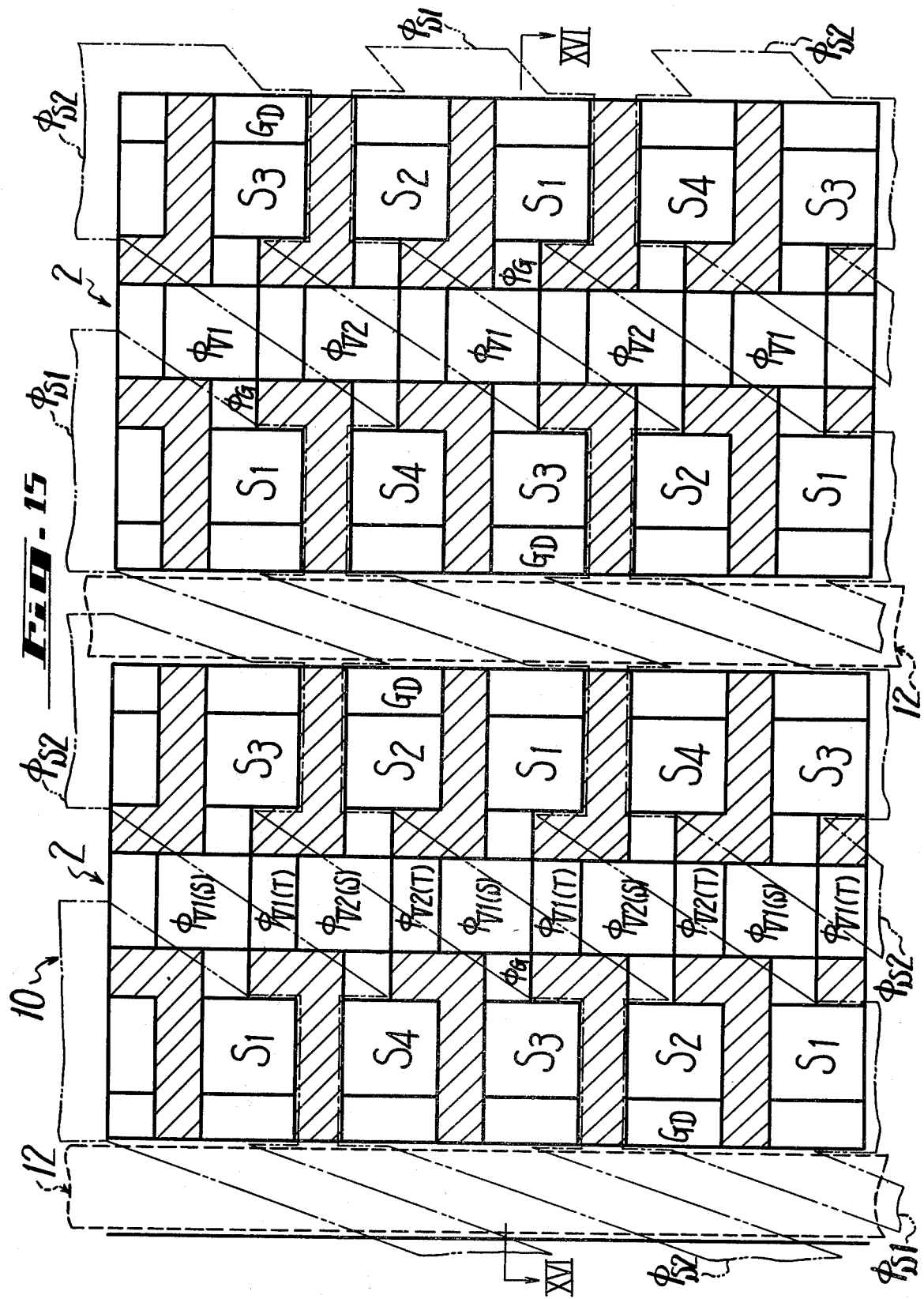

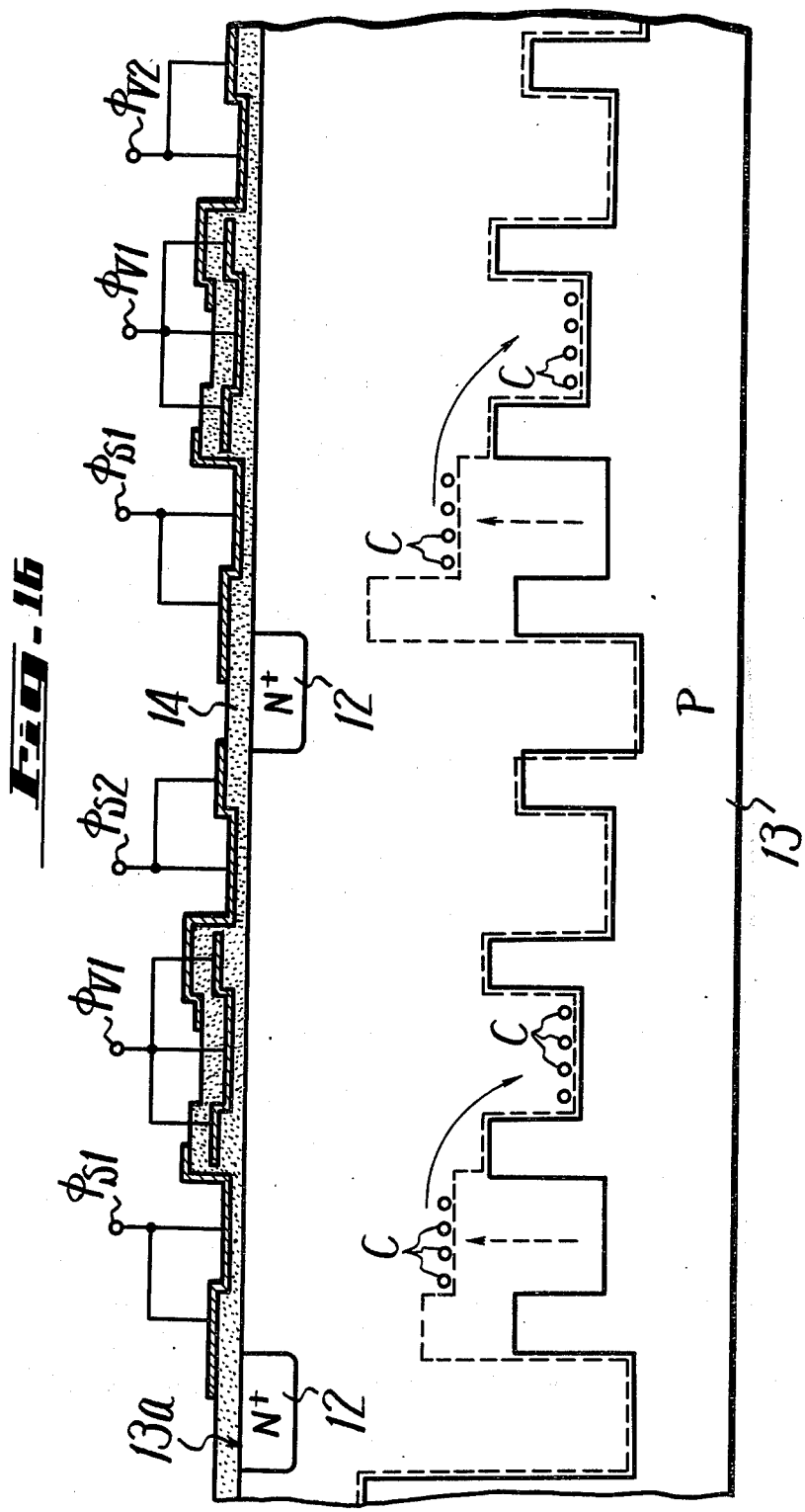

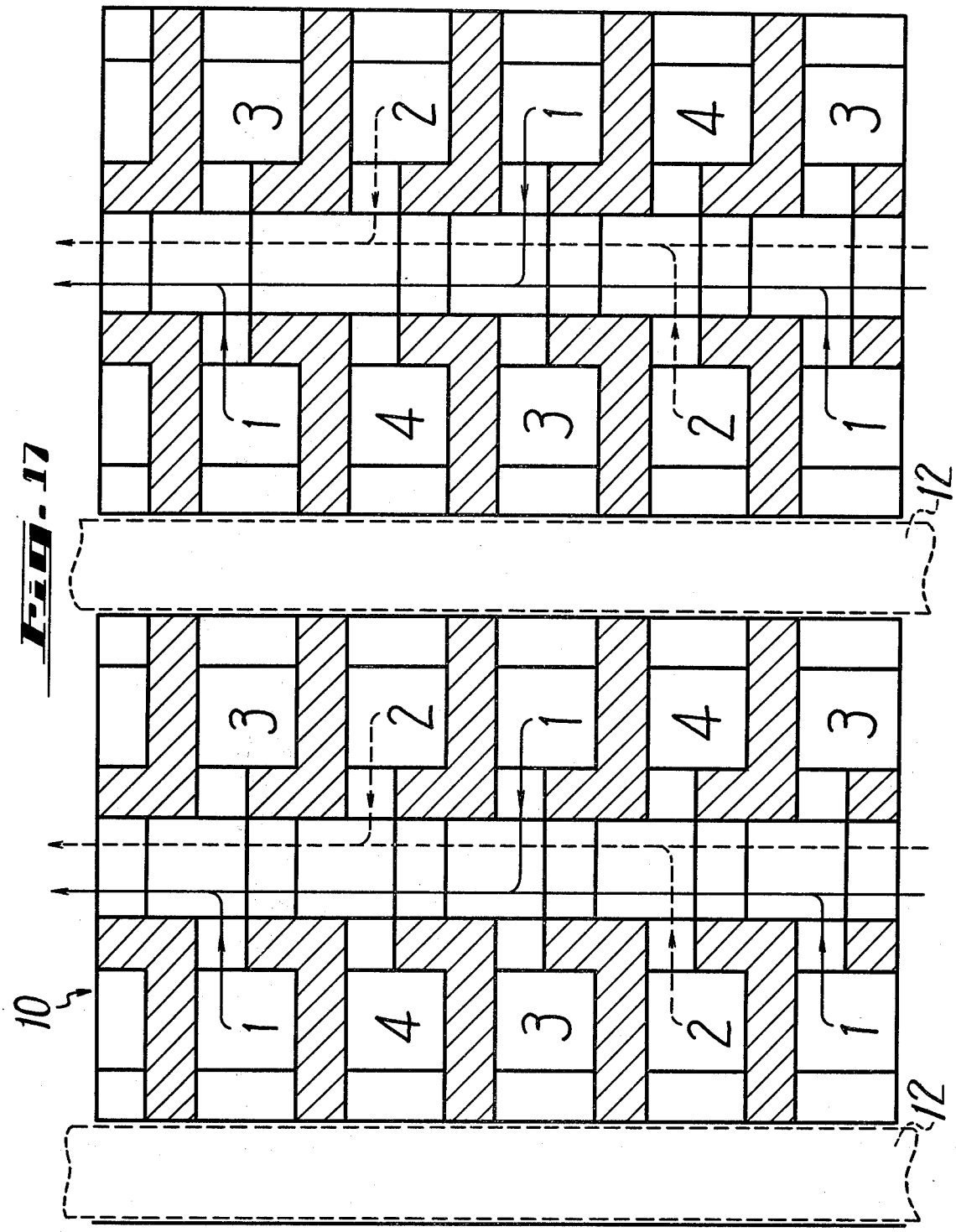

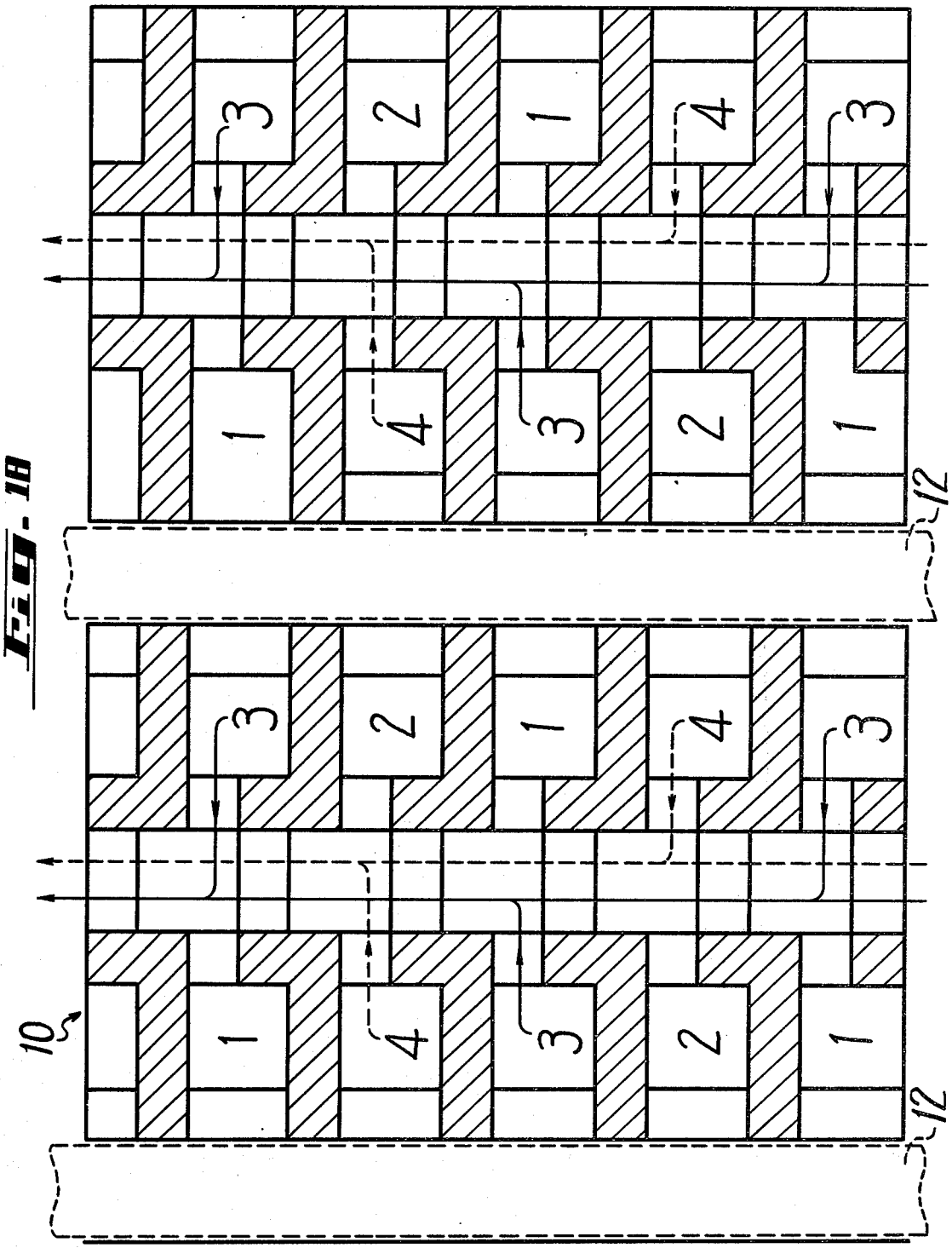

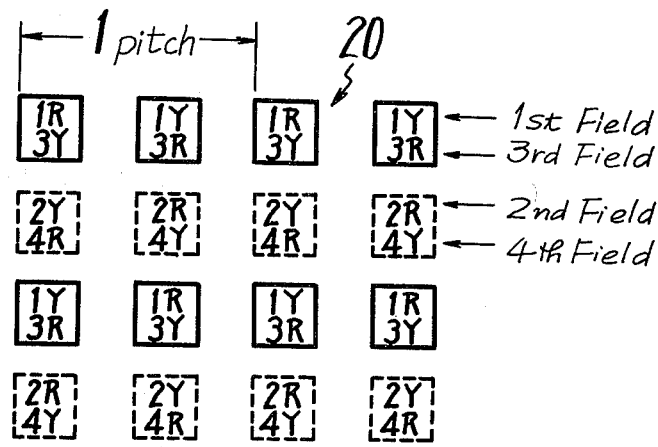
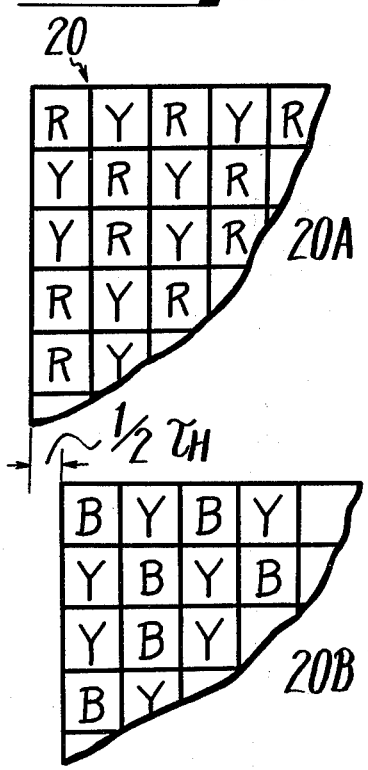
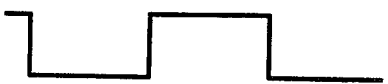

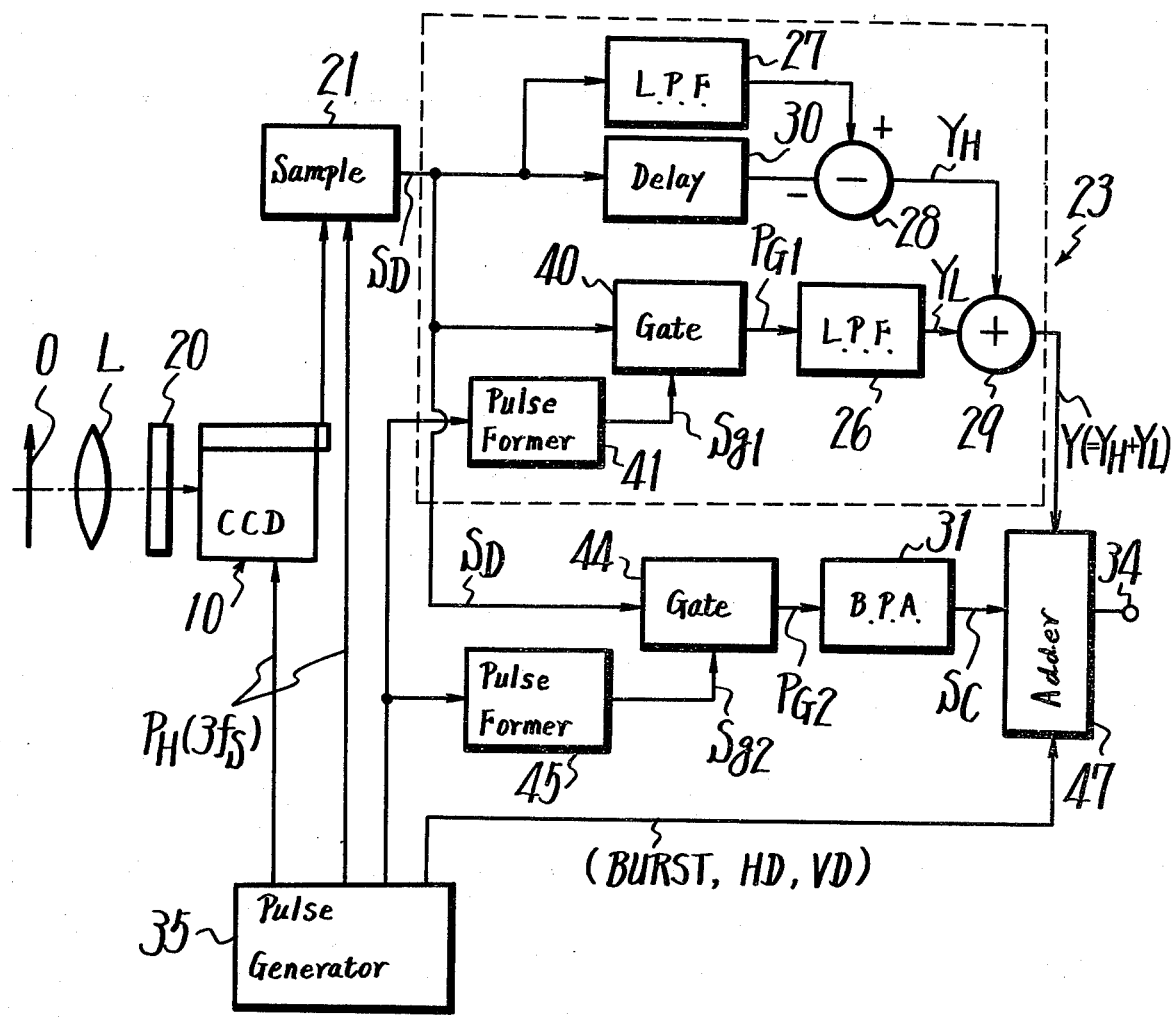

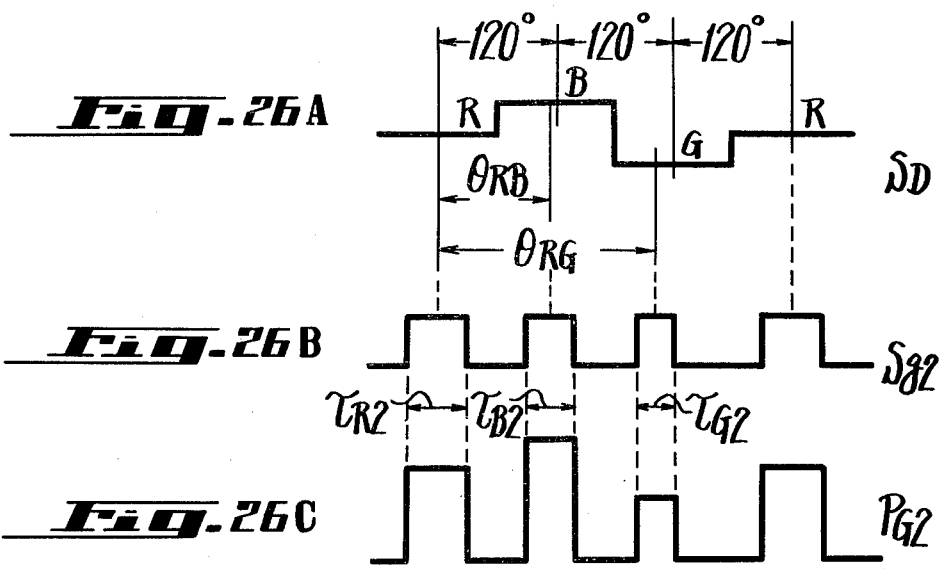
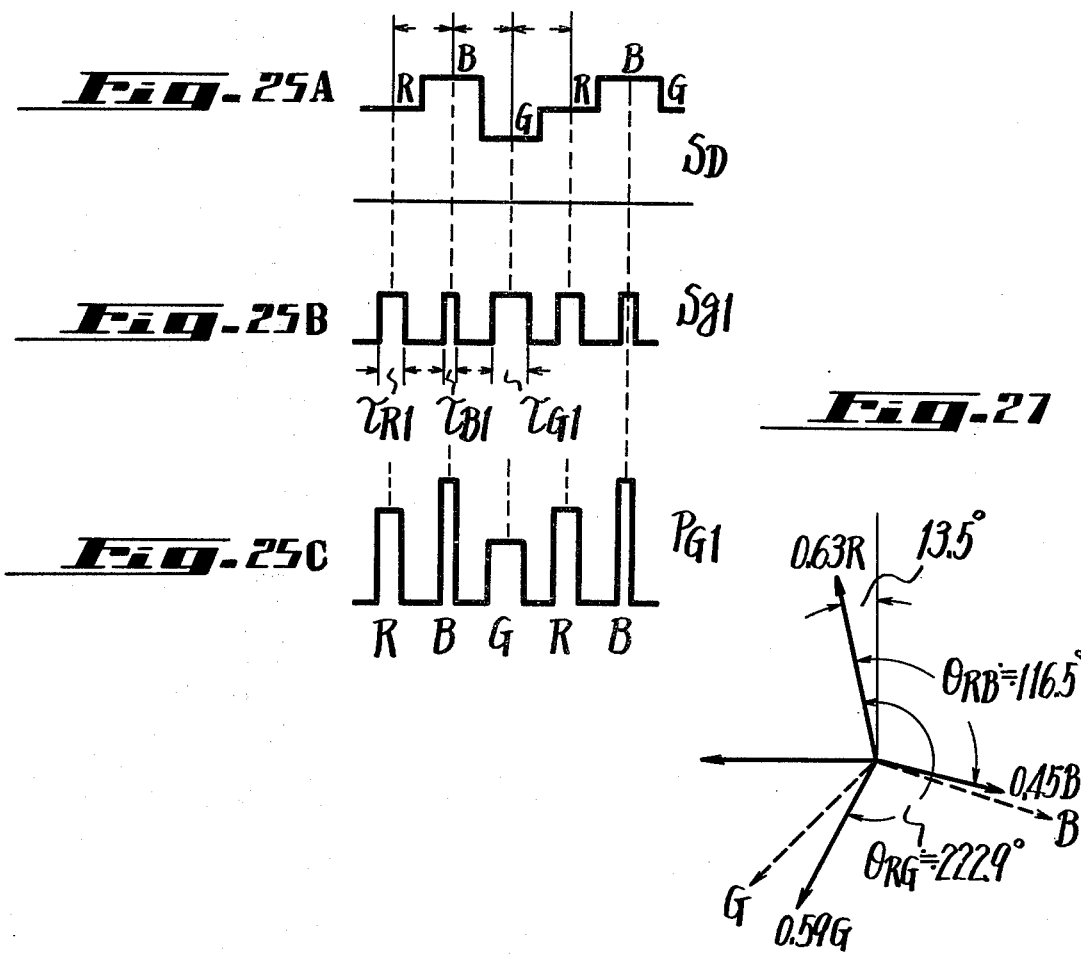

SOLID STATE COLOR CAMERA

BACKGROUND OF THE INVENTION

1. Field of the Invention

This invention relates generally to a solid state color camera, and is directed more particularly to a solid state color camera which employs as its solid state image sensing device a semiconductor body such as a charge coupled device (CCD) chip, a bucket brigade device (BBD) or the like.

2. Description of the Prior Art

In the art there is proposed such a solid state color camera using a CCD ship which takes an interline transfer system in the transfer systems for carriers produced in response to an object to be picked up. The CCD chip in the form of the above carrier transfer system generally has one vertical shift register for each of a plurality of image sensing elements which are arranged in the vertical direction. The carriers from the respective vertical shift registers are fed to a horizontal shift register by 1H (H is one horizontal scanning line) and the information of 1H is read out from the output terminal of the horizontal shift register. The frequency of a clock pulse $P_H$ applied to the horizontal shift register is selected generally as 4.5 MH$_z$ or more. If, however, the frequency of the clock pulse $P_H$ is selected to be the color subcarrier frequency of the standard color television signal of the NTSC system, since there is no need to convert the clock frequency to the color subcarrier frequency, a signal process circuit for converting an output signal of the camera to a signal of the NTSC system becomes simple. The above is described in the U.S. application, Ser. No. 794,804, whose assignee is the same as that of the present application and which was filed May 9, 1977. If, however, the clock frequency is selected to be the same as the color sub-carrier frequency, the following problem appears. It is well known in the NTSC system, the phase of the color subcarrier frequency $f_S$ returns to the original one at every four fields. If the arrangement pitch of image sensing elements in a CCD chip in the horizontal direction is selected as $\tau_H$, there occurs in such a case, depending upon the phase relation of the image sensing elements and the color sub-carrier frequency $f_S$, no signal reading can be achieved from a vertical shift register in which no image sensing element exists. Thus, it becomes necessary that the signals corresponding to the image sensing elements on the vertical shift register be such signals as are provided by shifting signals from image sensing elements on the left and right sides of the vertical shift retister by a time corresponding to $\frac{1}{2}\tau_H$. To this end, if the signal is read out in the order of the phase of the color sub-carrier frequency, it is necessary to provide a phase adjusting circuit and hence it is also necessary to provide a switching signal generator circuit which produces a switching signal for the phase adjustment. As a result, the whole circuit construction becomes complicated and it becomes meaningless to select a clock frequency which is the same as the color sub-carrier frequency.

Further, even if the phase is corrected and the normal phase is obtained, since the inherent picture element is shifted by $\frac{1}{2}\tau_H$, the positional movement or shift of the image can not be corrected.

SUMMARY OF THE INVENTION

It is an object of the present invention to provide a solid state color camera free from the drawbacks of the prior art.

According to one embodiment of the present invention, three CCD chips are used, the frequency of a clock pulse $P_H$, which is applied to the horizontal shift registers of CCD chips, is so selected that a color signal, which has the carrier with the same frequency as the color sub-carrier frequency $f_S$ of a standard system of NTSC system of a television broadcasting, can be obtained at the output terminals of the CCD chips, and the signal read-out is carried out in the order of the phase of the color sub-carrier frequency $f_S$. Thus, with the present invention, a signal processing circuit which is used in the prior art to convert the carrier frequency of a primary color signal to the color sub-carrier frequency $f_S$ can be omitted, and also the phase correction when the carrier frequency is selected as the color sub-carrier frequency $f_S$ is of no use, so that a phase correcting circuit for the above purpose and the circuitry for driving the same becomes useless and accordingly, the whole circuit construction becomes much simpler. Further, with the invention, since the spacial picture image sensing element arrangement becomes the same as the reproduced picture element arrangement, a reproduced picture is not deteriorated.

In the above prior art achieving the phase correction, the spacial picture element arrangement does not coincide with the reproduced picture element arrangement due to the phase correction but they are shifted by $\frac{1}{2}\tau_H$ in the left or right side, so that a reproduced picture is deteriorated. This invention is free from such a prior art defect.

If in this invention three CCD chips are used, a signal color filter, which passes therethrough one of the red (R), green (G) and blue (B) color lights, respectively, is located at the front of each of the three CCD chips, respectively, and the outputs from the respective CCD chips are composed, a desired color video signal, the carrier frequency of each primary color of which is 3.58 MH$_z$, can be obtained.

According to another embodiment of the present invention, if two or one of the CCD chips is used and the frequency of the read-out clock for the horizontal shift register of the CCD chips is selected as 2 $f_S$ in case of two CCD chips and as 3 $f_S$ in case of one CCD chip, respectively, a color or chroma signal, which has the repeating frequency which is the same as the color sub-carrier frequency of the NTSC system television signal, can be directly obtained from the CCD chip similar to the camera of the CCD chip system.

The other objects, features and advantages of the present invention will become more clear from the following description taken in conjunction with the accompanying drawings.

BRIEF DESCRIPTION OF THE DRAWINGS

FIG. 1 is a diagram showing an example of the solid state image sensor of an interline transfer system;

FIGS. 2A to 2D are diagrams used for explaining the phase relation of the color sub-carrier signal of the NTSC system;

FIG. 3 is a diagram showing the relation of the solid state image sensor and phase of a color sub-carrier frequency;

FIG. 4 is a schematic diagram used for explaining the signal read-out in the prior art;

FIG. 5 is a schematic diagram used for explaining the signal read-out of the present invention;

FIG. 6 is a schematic diagram showing the relation of the signal read-out to electrodes;

FIG. 7 is a plan view showing a part of an example of a solid state image sensor suitable for use in the solid state color camera according to the present invention;

FIGS. 8 to 11 are cross-sectional views taken on the lines VII—VII, IX—IX, X—X and XI—XI in FIG. 7, respectively;

FIGS. 12A to 12D are waveform diagrams showing pulses used for driving the solid state image sensor;

FIGS. 13 and 14 are diagrams showing the carrier transfer or shift direction of the example shown in FIG. 7, respectively;

FIG. 15 is a plan view showing another example of the solid state image sensor usable in the camera of the present invention, similar to FIG. 7;

FIG. 16 is a cross-sectional view taken on the line XVI—XVI in FIG. 15;

FIGS. 17 and 18 are diagrams showing the carrier transfer or shift direction of the example shown in FIG. 15, respectively;

FIG. 19 is a conceptional diagram of a color filter used for the case where two CCD chips are employed;

FIG. 20 is a diagram showing a part of an example of the practical color filter;

FIG. 21 is a block diagram showing a main part of an example of the circuitry for the camera of the invention;

FIGS. 22A to 22B are diagrams used for explaining the operation of the circuitry shown in FIG. 21;

FIG. 23 is a diagram showing a part of a color filter which is used in the camera in which a single CCD chip is employed;

FIG. 24 is a block diagram showing an example of the circuitry of the camera in which a single CCD chip is used; and FIGS. 25A to 25C, 26A to 26C and 27 are diagrams used for explaining the operation of the circuitry shown in FIG. 24, respectively.

DESCRIPTION OF THE PREFERRED EMBODIMENTS

As described previously, there is proposed a solid state image sensor using a CCD chip which takes the form of the interline transfer system for the carrier produced in response to an object to be picked up.

FIG. 1 shows an example of a CCD chip 10 which takes the form of an interline transfer system. As shown in FIG. 1, the CCD chip 10 includes a plurality of picture elements or image sensing elements 1 aligned in the vertical direction (in the figure column direction), which form plural vertical or column lines. A single vertical shift register 2 is provided for each of column lines consisting of plural image sensing elements 1, and the carriers from the respective vertical shift registers 2 are fed to a horizontal shift register 3 by 1H. Then, the information of 1H is read out from a terminal 7. In FIG. 1, arrows indicate the carrier transfer or shift direction, respectively.

The CCD chip 10 shown in FIG. 1 is formed for such a case that a mirror image of an object (not shown) is projected through a lens system (not shown) on the CCD chip 10, but if the positive image of the object is projected on the CCD chip 10 through the lens system, the CCD 10 shown in FIG. 1 is so formed that their image sensor elements are reversed with respect to the vertical shift register 2.

A pickup or sensor clock pulse $P_S$, which will act to induce carriers in the corresponding image sensing elements 1, is fed to the sensor elements 1 through a terminal 4, and a transfer or shift pulse $P_V$ ($P_{V1}$, $P_{V2}$) of, for example, 2-phase is fed to the vertical shift registers 2 through a terminal 5. Also, a clock pulse (sampling pulse) $P_H$ of 2-phase is fed to the horizontal shift register 3 through a terminal 6.

The frequency of the clock pulse $P_H$ fed to the horizontal shift register 3 is selected generally as 4.5 MHz or more in the prior art. In the case, however, that the frequency of the clock pulse $P_H$ is selected as the color sub-carrier frequency $f_S$ of a color television video signal in the standard television broadcasting system, for example, NTSC system, since there is no need to convert the clock frequency, i.e., the repetitive frequency of the output chroma or color signal from the CCD chip 10 to the color sub-carrier frequency $f_S$ (3.58 MHz), a signal processing circuit for converting the output of the camera to the signal of the NTSC system becomes simple in construction. Only the selection that the clock frequency is selected as the color sub-carrier frequency $f_S$ will be accompanied with the following problem.

As well known in the NTSC system one field is completed by the horizontal scanning lines of 1H to 262.5H, and by the process that the horizontal scanning lines of 262.5H to 525H are interlaced with the scanning lines of the first field, the phase of the color sub-carrier frequency $f_S$ is inversed at every line in the same field as shown in FIGS. 2A and 2B, is also inversed at every field in the same frame, and is inversed at every frame within two frames, so that the phase of color sub-carrier frequency $f_S$ returns to the original once at every 4th field. As a result, if the phases in the first field are marked with "0" and those in the second to fourth fields are marked with "◊", "□" and "▨", the phase relation of color sub-carrier frequency $f_S$ becomes as shown in FIG. 2C in which $\tau_H$ represents the repeating pitch of image sensors 1 in the horizontal direction. Thus, the repeating of a predetermined phase between the adjacent fields is shown in FIG. 2C by arrows and it will be noted that the regularity shown in FIG. 2D exists.

If the arranging pitch of the image sensing elements or sensors 1 of CCD chip 10 in the horizontal direction is selected as $\tau_H$, the phase relation between the image sensing elements 1 and color sub-carrier frequency $f_S$ becomes as shown in FIG. 3. Since no signal is read out from the vertical shift register 2 which has no image sensing element 1, as a signal corresponding to the image sensing element on the vertical shift register 2, a signal, which is obtained by shifting the signal obtained from the inherent image sensing elements 1 existing on the left and right sides of the vertical shift register 2 by a time corresponding to $\frac{1}{2}\tau_H$, must be used. To this end, in order to read out the signal with the phase the same as that of the color sub-carrier frequency $f_S$ or in the order of its phase, it is necessary to provide a phase adjusting circuit and also to provide a switching signal generator for the phase adjusting. As a result, the circuit becomes complicated naturally and hence it becomes meaningless that the clock frequency is selected as the color sub-carrier frequency $f_S$.

Even if the phase is corrected to be coincident with the normal phase, the positional shift of an image can not be corrected since the signal corresponding to the inherent image sensing element is shifted by $\frac{1}{2}\tau_H$.

The present invention is to avoid the above defect by employing a special signal reading out manner.

In the prior art, the signals stored in all the image sensors 1 are read out in the order indicated by the numerals of FIG. 4 within the period of 1 field as the output of the CCD, while in the present invention the signal is read out in the order of the phase of the color sub-carrier frequency $f_S$ of the NTSC system color television signal. That is, in the invention as shown in FIG. 5, the image sensing elements, from which signals are to be read out are determined in accordance with the field. In FIG. 5, the numerals represent the order of signal reading out in accordance with the respective field orders. In a first embodiment of the invention, three CCD chips each having the signal reading out order shown in FIG. 5 are used and color filters for deriving R, G and B color signals therefrom are provided for the respective CCD chips.

The first preferred embodiment of the invention will be now described with reference to the drawings. In order to carry out the signal reading in the order shown in FIG. 5, the electrode provided in connection with each of the image sensing elements is divided into two electrode members, for example, as shown in FIG. 6, into an image sensing element group (marked with hatches) which are read out at first and second fields and an image sensing element group (with no hatch) which are read out at third and fourth fields, and the respective element groups are supplied with desired pickup pulses or sensor clock $P_{S1}$ and $P_{S2}$ (which will be described later).

A CCD chip 10, from which the signal is read in by the above special manner, will be described with reference to FIGS. 7 to 11. FIG. 7 is a fragmentary plan view of the above CCD chip 10, and FIGS. 8 to 11 are cross-sectional views taken on the lines VIII—VIII, IX—IX, X—X and XI—XI in FIG. 7.

In FIG. 7, letters $S_1$, $S_2$, $S_3$ and $S_4$ designate image sensing elements or sensors on which an image of an object is projected and suffixed numerals 1 to 4 indicate the field number, respectively. Now, one series or group of image sensors arranged in the column or vertical direction will be considered. In each series, the image sensors corresponding to the first to fourth fields in the carrier transfer direction (indicated by the arrows) are arranged sequentially at a unit period consisting of four image sensors, and a channel stopper 11 is formed between the adjacent series of the image sensors with hatches in FIG. 7. The channel stopper 11 is so formed to approximately surround four edges of each sensor. Between the portion of channel stopper 11 extending in the vertical direction and the sensors there is formed an overflow drain 12, and a control gate $G_D$ is provided for the overflow drain 12.

One vertical shift register 2 is provided for one series of image sensor group extending in the vertical direction, since the vertical shift register 2 is driven by transfer or shift pulses $P_{V1}$ and $P_{V2}$ of 2-phase, electrodes $\phi_{V1}$ and $\phi_{V2}$ for 2-phase are provided. In order to determine the direction of carrier transfer as shown in FIG. 9, the electrodes $\phi_{V1}$ and $\phi_{V2}$ are so formed that the thickness of an insulating layer 14 formed of $SiO_2$ or the like on an upper surface 13a of a semiconductor substrate 13 is changed to change the depth of a potential 15 (solid line in FIG. 9) and hence to form a potential barrier and a potential well 15a under the insulating layer 14 whose thickness is thin. As shown in FIG. 7, the electrodes provided on the thin portions of insulating layer 14 are called storage electrodes and they are marked with $\phi_{V1}(S)$ and $\phi_{V2}(S)$, respectively. Similarly, electrodes corresponding to the thick portions of insulating layer 14 are called transfer electrodes and they are marked with $\phi_{V1}(T)$ and $\phi_{V2}(T)$, respectively.

Between the image sensor 1 and storage electrodes $\phi_{V1}(S)$, $\phi_{V2}(S)$ there is provided a transfer gate $\phi_G$ for transferring the carriers of sensors 1 to the potential wells 15a, but the transfer gate $\phi_G$ is a part of the storage electrodes $\phi_{V1}(S)$, $\phi_{V2}(S)$ and only the thickness of $SiO_2$ layer 14 is different as shown in FIG. 8.

With the present invention, the electrode $\phi_S$ provided in connection with sensor 1 for supplying the pickup or sensor pulse is divided into two electrodes $\phi_{S1}$, $\phi_{S2}$ which are supplied with the desired sensor clock pulses $P_{S1}$, $P_{S2}$, respectively, as shown in FIG. 6. That is, to the image sensors $S_1$ and $S_2$ which are used at the first and second fields, the first electrode $\phi_{S1}$ is provided commonly, and similarly to the image sensors $S_3$ and $S_4$ at the third and fourth fields the second electrode $\phi_{S2}$ is provided commonly. These electrodes $\phi_{S1}$ and $\phi_{S2}$ are formed such that they cover the regions of the respective image sensors and the gates $G_D$ of the overflow drains 12. In this case, a transparent electrode is employed as each of the electrodes $\phi_{S1}$ and $\phi_{S2}$, and the CCD chip 10 is optically shielded except the areas of the image sensors $S_1$ to $S_4$.

In this case, it is assumed that when the voltage applied to the electrodes $\phi_S$ and $\phi_V$ of CCD chip 10 is changed from "1" to "0", the potential well in CCD chip 10 becomes shallow. The image sensor 1 and vertical shift register 2 are supplied with pulses shown in FIGS. 12A to 12D, respectively. The sensor clock pulse $P_S$ fed to the first and second electrodes $\phi_{S1}$, $\phi_{S2}$ consists, similar to the prior art, of a storage pulse $P_{SC}$ which acts to induce the carrier corresponding to the light information of the object and a pulse (hereinafter referred to as a gate pulse) $P_{ST}$ which will transfer the carrier to the vertical shift register 2, and has the unit period of 4-field (4 V).

The first sensor clock pulse $P_{S1}$ fed to the first electrode $\phi_{S1}$ has the gate pulse $P_{ST}$ in each vertical blanking period V·BLK of the first and second fields as shown in FIG. 12A, while the second sensor clock pulse $P_{S2}$ fed to the second electrodes $\phi_{S2}$ has the gate pulse $P_{ST}$ at the third and fourth fields, as shown in FIG. 12B.

As first and second vertical shift clock pulses $P_{V1}$ and $P_{V2}$ ($P_{V2}=\overline{P_{V1}}$) fed to the first and second electrodes $\phi_{V1}$ and $\phi_{V2}$ of each vertical shift register 2 are such pulses, whose phases are inversed at every field as shown in FIGS. 12C and 12D.

The operation to read out the signal from the CCD chip 10 by the above pulses will be described with reference to FIGS. 8 and 9. By way of example, the signal reading out operation in the first field (in FIG. 12, the period with the mark IV) will be described. Since within the storage period substantially corresponding to one vertical period the potential in the CCD chip 10 is such that the potential shown in FIG. 8 by the solid line, the carriers are induced in the image sensors corresponding to the image of an object. In this case, within the storage period of the carrier, in order to transfer the carrier in the vertical shift register 2, the vertical shift pulses $P_{V1}$ and $P_{V2}$ become "1" and "0" alternatively, but for the sake of simplicity in FIG. 8, the potential well under the electrode $\phi_{V1}$ is only deep. The carriers of the image sensors $S_1$ and $S_2$, to which the first sensor clock pulse $P_{S1}$ is fed, are transferred to the vertical shift register 2 in the transfer period following the storage period. Since the vertical shift clock pulses $P_{V1}$ and $P_{V2}$, which are inverse in phase, are applied to the electrodes $\phi_{V1}$ and $\phi_{V2}$ formed on the vertical shift register 2, respectively, if the phase relation therebetween is selected, for example, as shown in FIGS. 12C and 12D, due to the potential relation of the vertical shift clock pulses $P_{V1}$ and $P_{V2}$, i.e., $\phi_{V1}=$"1" and $\phi_{S1}=$"0" in a period P, only the potential well under the electrode $\phi_{V1}$ becomes deep and the potential well under the electrode $\phi_{S1}$ becomes shallow. In other words, the potential relation of vertical shift register 2 becomes as shown in FIG. 9 by dotted lines, so that only a carrier C in the image sensor $S_1$ is transferred to the vertical shift register 2 through the transfer gate $\phi_G$. Accordingly, the carrier induced in the sensor $S_2$ is not transferred even if the potential of the common electrode $\phi_{S1}$ to the sensors $S_1$ and $S_2$ becomes "0".

After the transfer period is over, the vertical shift register 2 is supplied with the vertical shift clock pulses $P_{V1}$ and $P_{V2}$ with the period of 1H as shown in FIGS. 12C and 12D. Therefore, the carrier in the vertical shift register 2 is transferred to the horizontal shift register 3 in this period as in the prior art.

FIG. 8 shows the carrier transfer from the sensor $S_1$ to the vertical shift register 2. In FIG. 8, the potential indicated by the dotted line (corresponding to the depth of the well) indicates that when $\phi_{S1}=$"0" and $\phi_{V1}=$"1", the carrier C is read out. FIG. 10 shows that the clock wiring of electrodes $\phi_{V1}$ and $\phi_{V2}$ extends on the channel stopper 11, FIG. 9 shows that the carrier transfer in the vertical shift register 2 is carried out in the vertical direction, in which the dotted line of the potential shows that when $\phi_{V1}=$"0" and $\phi_{V2}=$"1", the carrier is transferred, and FIG. 11 shows that the respective image sensors $S_1$ to $S_4$ are isolated by the channel stopper 11.

The carriers transferred in parallel to the horizontal shift register 3 are read out sequentially by one sensor with the clock pulse $P_H$ applied to the horizontal shift register 3. The frequency of clock pulse $P_H$ is selected as the color subcarrier frequency $f_S$ as set forth above (in the case that three CCD chips 10 are used for each of R, G and B colors, selected as 3.58 MH$_z$).

Since the shift clock pulses $P_{V1}$ and $P_{V2}$ are inversed in phase at every 1 V, when the second field arrives, only the potential under the electrode $\phi_{V2}$ becomes deep by the other shift clock pulse $P_{V2}$. As a result, only the carrier in the sensor $S_2$ is transferred to the vertical shift register 2, then to the horizontal shift register 3 at an interval of 1H, and then read out sequentially. FIG. 13 shows the transfer direction of the carrier in the former two fields. In FIG. 13, the solid line arrows represent the carrier transfer at the first field and the dotted line arrows represent that at the second field, respectively.

Similarly, in the latter two fields, by the combination of the second sensor clock pulse $P_{S2}$ and shift clock pulses $P_{V1}$, $P_{V2}$, the carriers are read out in the order from sensor $S_3$ to sensor $S_4$ at every field. FIG. 14 shows the carrier transfer in the latter two fields.

If the carrier or signal is read out by the above clock pulses, the signal can be read out with the phase same as that of the color sub-carrier frequency $f_S$. Therefore, if three CCD chips, for example, are prepared, monochrome filters each of which passes therethrough one of R, G and B color lights are located at the front of the CCD chips and the outputs from the respective CCD chips are composed, a desired color video signal, in which the carrier frequency of each of the primary color signals is 3.58 MH$_z$ can be obtained.

As described above, in the example of the present invention in which three CCD chips are used, the frequency of the clock pulse $P_H$ fed to the horizontal shift register 3 is selected the same as the color sub-carrier frequency $f_S$ in the NTSC system which is the standard system of a television broadcasting, and the signal is read out in the order of the phase of the color sub-carrier frequency $f_S$. Accordingly, with the present invention, a prior art signal processing circuit, which converts the carrier frequency of the primary color signal to the color subcarrier frequency $f_S$, can be omitted, and hence the phase correction, which is necessary when the carrier frequency is converted to the color sub-carrier frequency $f_S$ is not required. Thus, the phase correcting circuit for the above phase correction and the circuitry for driving the phase correcting circuit are no longer needed with the result that the circuit of the present invention can be greatly simplified.

Further, with the present invention, the spacial arrangement of image sensors becomes the same as the arrangement of the reproduced sensor or picture elements, and hence no deterioration is caused in a reproduced picture. With the prior art achieving the phase correction, the spacial arrangement of sensors doe not coincide with that of reproduced picture elements and they are shifted by $\frac{1}{2}\tau_H$ in the left or right direction due to the phase correction. As a result, a reproduced picture is deteriorated in the prior art.

In the above example of the invention, such a CCD chip is used in which one vertical shift register is provided for one vertical arrangement of sensors. However, the present invention can be applied to such a CCD chip in which a vertical shift register is used commonly to some vertical arrangements of sensors, i.e., one vertical shift register is provided for two vertical arrangements of sensors. If such, a CCD chip is conveniently called a modified CCD chip in which one vertical shift register is used common to two arrangements of sensors. This modified CCD chip is shown in FIG. 15 at 10, in which a set is formed of one vertical shift register 2 and two arrangements of sensors located at the left and right sides of the single vertical shift register 2 and a plurality of the above sets are aligned in the horizontal scanning direction with the overflow drain 12 between the adjacent sets. In FIG. 15, the hatched regions indicate the channel stoppers as set forth above. Since the sensors to be read out at the respective fields are similar to the previous example, the wiring of electrodes same as that of the former example shown in FIG. 7 is employed. Although the detailed description thereof will be omitted, the relation of the potentials of clock pulses applied to the respective electrodes $\phi_{S1}$, $\phi_{S2}$, $\phi_{V1}$ and $\phi_{V2}$ and sensors to be read out is shown in the following Table I in connection with FIG. 15.

TABLE I

| Timing | Sensor Clock | | V-register Clock | | Read Out |
| --- | --- | --- | --- | --- | --- |
|  | $\phi_{S1}$ | $\phi_{S2}$ | $\phi_{V1}$ | $\phi_{V2}$ | Sensor |
| 1st Field | "0" | "1" | "0" | "1" | Sensor 1 |
| 2nd Field | "0" | "1" | "1" | "0" | Sensor 2 |
| 3rd Field | "1" | "0" | "0" | "1" | Sensor 3 |
| 4th Field | "1" | "0" | "1" | "0" | Sensor 4 |

FIG. 16 is a cross-sectional view of the modified CCD chip 10 on the line XVI—XVI in FIG. 15, which corresponds to FIG. 8, for illustrating the potential relation by the clock pulses applied to the electrodes in the storage period (solid line) and transfer or shift period (solid line) of the first field.

The clock pulses used in the modified CCD chip 10 are such clock pulses with the time relation as those of the clock pulses shown in FIG. 12.

The signal (carrier) transfer directions of the modified CCD chip 10 in the respective fields are shown in FIGS. 17 and 18, respectively, similar to the former example.

In the case that the modified CCD chip 10 is used, if the frequency of the clock pulse $P_H$ applied to the horizontal shift register 3 is selected as the color sub-carrier frequency $f_S$ and the signal is read out with the same phase as that of the color sub-carrier frequency $f_S$, the same effect as that of the former example can be achieved. In this modified CCD chip 10, the area occupied by two sensors in the horizontal direction becomes about ⅔ as compared with that of the prior art CCD chip and hence the apparatus or camera of the invention becomes compact and improves the resolution.

FIG. 19 and the following figures show other examples of the invention in which the CCD chip, one or two are used to produce a desired color video signal.

At first, the example in which two CCD chips are used will be described. The carrier color signal in a color video signal $E_O$ of the NTSC system is expressed as its color subcarrier being modulated by color difference signals (R-Y) and (B-Y) of R and B, as is well known, so that if a color video signal is provided by using two CCD chips, it is desired in view of simplifying the signal process that the above color difference signals be directly obtained from the CCD chips as camera outputs.

Next, the color filter and circuitry for this purpose will be described. The filter for obtaining the color difference signal of R will be described first. Since the color informations of R and Y have the phase difference of 180°, an imaginary color filter 20, which will satisfy the reading out relation shown in FIG. 5, is shown in FIG. 19. Now, if two sensors in the horizontal scanning direction are taken as one pitch and the light separation characteristic is selected to produce the informations of R and Y alternatively, the filter elements of the first and second fields pass therethrough color lights as shown in the upper side of FIG. 19. The phase of the color sub-carrier carrier frequency $f_S$ at the third field is inverse to that at the first field, and similarly the phases at the second and fourth fields are inverse. Thus, the light separation characteristics at the latter fields (3rd and 4th fields) are reverse from those of the former fields (1st and 2nd fields) and hence the filter components of the third and fourth fields pass therethrough the color lights shown in FIG. 19 at the lower side thereof.

Where it is impossible to form such a filter that a unit filter area or component corresponding to the area of one image sensor passes therethrough a color light of R at a certain field but a color light of Y at another field, i.e., the same unit filter area passes therethrough two different color lights. In other words, it is impossible that the R signal is obtained from one sensor in FIG. 19 at the first field and the Y signal is obtained from the same sensor at the third field.

Therefore, in an example of the invention, the color light corresponding to the former fields (1st and 2nd fields) is selected as the light separation characteristic of filter 20 with the colors shown in the upper side, and at the latter fields (3rd and 4th fields) the output at the latter fields is used after being inversed. Thus, the same output as that of the imaginary filter 20 shown in FIG. 19 can be obtained.

Therefore, in the example of the invention, a color filter 20A of a mosaic form shown in FIG. 20 is used. As may be understood from the comparison of FIGS. 19 and 20, the light separation characteristic of filter 20A is such a characteristic which appears when the upper side of sensors of FIG. 19, i.e., the former fields (1st and 2nd fields) are scanned, and at the latter fields (3rd and 4th fields) the outputs (1R, 1Y, 1R, 1Y, 2Y, 2R, 2Y, 2R, . . . ) at the former fields are electrically inversed. Similarly, the color difference signal of B can be obtained from a color filter 20B which passes therethrough B and Y color lights. Since, as well known, the phase difference of 90° exists between the color difference signals of R and B in the color signal of the NTSC system, in practical use, for example, the filter 20B is displaced from the filter 20A by a distance corresponding to 90° or ½$\tau_H$ as shown in FIG. 20. However, instead of displacing the filters 20A and 20B, it is possible that the signals are electrically processed, for example, by using a delay line.

An example of the circuitry using the above two filters 20A and 20B is shown in FIG. 21. A beam object 0 is cast on CCD chips 10A and 10B through a lens system L and filters 20A and 20B. In this example, a pair of CCD chips 10A and 10B are supplied through terminals 6 with the clock pulse $P_H$ whose frequency is selected twice as the color sub-carrier frequency $f_S$ so as to read out also the informations of sensors at ½ pitch shown in FIG. 19. Sampling hold circuits 21A and 21B, which are connected to receive the outputs of CCD chips 10A and 10B, are also supplied with the same clock pulse $P_H$ to be driven. The sampling signal or clock pulse $P_H$ fed to the sampling hold circuits 21A and 21B is shown in FIG. 22D. Picked-up or sensed signals (dot-sequence signals) $S_A$ and $S_B$ from the CCD chips 10A and 10B through the sampling hold circuits 21A and 21B are fed through process circuits 22A and 22B, each including a γ correcting circuit and so on, to luminance and color difference signal process circuits 23, 24A and 24B, respectively.

Now, the process circuit 23 for the luminance signal Y will be described. The respective picked-up output signals $S_A$ and $S_B$ consist of signal components shown in FIGS. 22A and 22B, so that the signals $S_A$ and $S_B$ passed through the process circuits 22A and 22B are fed to a switch SW₁, which is controlled by a switching signal $S_W$ shown in FIG. 22E, whose switching frequency is selected as $2f_S$, to be composed as a composite signal $S_c$ shown in FIG. 22C. The composite signal $S_C$ is fed to a sampling hold circuit 25 which carriers out the sampling hold by a sampling signal $S_Y$, shown in FIG. 22F, whose sampling frequency is selected as $f_S$. By this, luminance components $Y_R$ and $Y_B$ ($Y_R$ is a component obtained from the CCD chip 10A and $Y_B$ is a component from the other CCD chip 10B) are extracted from the composite signal $S_C$ and then fed to a low pass filter 26 which produces a luminance signal consisting of low components with frequency of, for example, 1 to 2 MHz.

The composite signal $S_C$ from the switch SW₁ is also fed to a low pass filter 27 whose filtering characteristic is selected the same as that of the low pass filter 26. The output signal of low pass filter 27 and signal $S_C$ are both fed to a subtracting circuit 28 which then produces a signal consisting of only high components in the composite signal $S_C$ (which includes the primary color components of R and B) and applies the same to an adding circuit 29 which is also supplied with the low component from the low pass filter 26. Therefore, the adding circuit 29 produces a composite luminance signal Y whose low component consists of inherent luminance signals $Y_R$ and $Y_B$ and whose high component is the high component of composite signal $S_C$. In FIG. 21, 30 designates a delay line which compensates for the time delay caused by the low pass filter 27.

Since the process circuits 24A and 24B for the R and B color difference signals are formed the same in construction, one of them or process circuit 24A will be now described. The process circuit 24A for the color difference signal (R-Y) is formed of a band pass amplifier 31A, a phase inverter (converter) 32A and a switch $SW_2$ which is switched at every 2 V. Since the side band components with the clock frequency $f_S$ as the center are used as the color difference signal of R, the band width of band pass amplifier 31A is selected to include the clock frequency $f_S$. Since it is sufficient that the inversed outputs are used as the color difference signals at the third and fourth fields as described in connection with FIG. 19, the switch $SW_2$ is changed as shown by the dotted line in FIG. 21 at the latter fields. Thus, the color difference signal (R-Y) is obtained from the switch $SW_2$.

The color difference signal (B-Y) can be similarly obtained from a switch $SW_3$ of the other process circuit 24B.

The color difference signals (R-Y), (B-Y) and the luminance signal Y thus obtained are, respectively, fed to a color encoder 33 which produces at its output terminal 34 a desired color video signal $S_{NTSC}$ of the NTSC system.

FIG. 23 and the following figures show an example which produces the color video signal $S_{NTSC}$ with a single CCD chip. FIG. 23 shows an example of the color filter 20 which is employed in the above example. This color filter 20 is formed as a vertical type filter consisting of R, G and B stripes. In this case, the order for reading out the signals is the same as that described previously.

An example of the color camera of the invention using the color filter 20 shown in FIG. 23 is shown in FIG. 24. In this example, although the process circuit 23 for the luminance signal Y is formed substantially the same as that of FIG. 21, the low components forming the luminance signal Y are produced as follows. In this example, the primary color signals are not matrixed, but the luminance signal of the NTSC system can be produced directly from each of the primary color signals of R, G and B which are obtained in a dot-sequence manner. Thus, a gate circuit 40 is provided at the input side of the low pass filter 26. A picked-up sensed signal $S_D$ through the sampling hold circuit 21 from the CCD chip 10, which is shown in FIG. 25A, is fed to the gate circuit 40.

A gate signal $S_{g1}$, which controls the gate circuit 40, is a pulse signal which is synchronized with the clock pulse $P_H$ fed to the CCD chip 10 and the same in frequency, but its pulse width is different in accordance with the primary color signal to be gated. That is, a level $E_Y$ of luminance signal Y of the NTSC system is expressed by the following equation (1) as well known.

$$E_Y = 0.30 E_R + 0.59 E_G + 0.11 E_B \qquad (1)$$

where $E_R$, $E_G$ and $E_B$ represent the levels of the primary color signals or R, G and B. Therefore, in order that the levels of the respective gated output signals satisfy the equation (1), it is sufficient that pulse width $\tau_{R1}$, $\tau_{G1}$ and $\tau_{B1}$ corresponding to the respective primary color signals R, G and B are selected to satisfy the following equation (2) (refer to FIG. 25B).

$$(\tau_{R1}/0.30) = (\tau_{G1}/0.59) = (\tau_{B1}/0.11) \qquad (2)$$

Thus, the gate circuit 40 produces a gated output signal (pulse width modulated signal) $P_{G1}$ shown in FIG. 25C, so that when the gated output signal $P_{G1}$ is passed through the low pass filter 26, it becomes possible for a low component which has the same level relation as that of the luminance signal of the NTSC system to be obtained. In FIG. 24, 41 designates a pulse former for producing the pulse signal $S_{g1}$. Thus, with the above signal process, a circuit for making the respective primary color signals simultaneous and a matrix circuit, which are necessary so as to produce the luminance signal of the NTSC system, become unnecessary.

The process circuit 24 for the color difference signals of R and B can utilize the pulse width modulation system similar to the case of the luminance signal. To achieve the pulse width modulation, a gate circuit 44 and a gate signal former 45 are provided. A gate signal $S_{g2}$ from the gate signal former 45 has pulse widths 96 $R_2$, $\tau_{G2}$ and $\tau_{B2}$ which are selected, as shown in FIG. 26B, to satisfy the following equation (3) so as to gate the respective primary color signals R, G and B.

$$(\tau_{R2}/0.63) = (\tau_{B2}/0.59) = (\tau_{G2}/0.45) \qquad (3)$$

When a pulse, which will gate the primary color signal of R, is taken as the center of phase, a phase difference $\theta_{RB}$ between the above pulse and a pulse, which will gate the primary color signal of B, and a phase difference $\theta_{RG}$ between the former pulse and a pulse, which will gate the primary color signal of G, are not selected as 120° and 240°, but calculated as follows.

$$\theta_{RB} \doteqdot 116.5°$$

$$\theta_{RG} \doteqdot 222.9° \qquad (4)$$

When the relation of the primary color signal R to the burst signal is selected as shown in FIG. 27, if the gated output signal $P_{G2}$ (refer to FIG. 26C) from the gate circuit 44 is fed to a bandpass amplifier 31, its output signal $E_C$ is expressed as follows.

$$\begin{aligned} E_C &= K \{0.63 R \cos(\omega_s t + 13.5°) + 0.45 B \cos(\omega_s t + 13.5° - 116.5°) \\ &\quad + 0.59 G \cos(\omega_s t + 13.5° - 222.9°)\} \\ &= K \left\{ \frac{R-Y}{1.14} \cos \omega_s t + \frac{B-Y}{2.03} \sin \omega_s t \right\} \end{aligned} \qquad (5)$$

where K is a constant and $\omega_s$ is an angular frequency of the clock pulse $P_H$.

That is, if the gated output signal $P_{G2}$, which is pulse width-modulated, is fed to the band pass amplifier 31, the carrier color signal $S_C$ of the NTSC system can be directly obtained.

Therefore, according to the above method, such a signal process circuit becomes unnecessary in which the side band components with the clock frequency as its center are detected and then fed to the encoder to be modulated to provide the carrier color signal.

The luminance signal Y and carrier color signal $S_C$, thus obtained, are fed to an adder 47 to be added with the synchronizing signals (VD, HD, burst signal and so on) from a pulse generator 35 which then produces the color video signal of the NTSC system.

As described above, with the present invention the signal is read out in accordance with the phase of color subcarrier frequency $f_S$ of the NTSC system to achieve the desired purpose, and there is no limitation to the number of CCD chips used in the camera. Also, a CCD chip of buried channel type can be used as the CCD chip of the present invention.

As may be apparent from the above description, the clock pulse $P_H$ is so selected that the repeating frequency of the color signal read out from the CCD chip becomes equal to the color sub-carrier frequency $f_S$ of the NTSC system. When three CCD chips are used for the respective primary colors, $f_H = f_S$. While when the primary color signals of R, G and B are provided from a single CCD chip, $P_H = 3 f_S$ (refer to FIG. 24), and when the color difference signals R-Y and B-Y are provided from two CCD chips, $P_H = 2 f_S$ (refer to FIG. 21).

The above description is given on the examples of the invention in which the color signal of the NTSC system is obtained, but it will be understood that the present invention can be applied to a case where the color signal of the PAL system is obtained.

Further, in the above examples of the invention, the CCD chip is employed as the solid state image sensor or device, but as the solid state image device of the invention, any of CTD (charge transfer device) chips such as BBD (bucket brigade device) or CID (charge injection device) and a MOS type solid state device can be used.

As used throughout, the term "CCD" shall be understood to mean charge coupled device, and the term "CTD" shall be understood to mean charge transfer device.

It will be apparent that many modifications and variations could be effected by one skilled in the art without departing from the spirit or scope of the novel concepts of the present invention, so that the spirit or scope of the invention should be determined by the appended claims.

We claim as our invention:

1. A solid state color camera comprising:
   (a) an image sensor having a plurality of image sensing elements aligned both in the horizontal and vertical directions;
   (b) a vertical shift register having a storage register for storing image informations sensed by said image sensing elements and a transfer register for transferring said image information from said image sensing elements to said storage register;
   (c) an output register connected to said vertical shift register for reading out said image informations stored in said vertical shift register;
   (d) an output terminal to which the color image signal from said output register is supplied;
   (e) filter means covering said image sensing elements, said filter means having a predetermined light separation characteristic through which said image sensing elements sense the predetermined limited color image informations;
   (f) electrode means for picking up said color informations from said image sensing elements and for transferring said color informations to said output register, said electrode means having a first group electrodes which correspond to said image sensing elements and a second group of electrodes which corresponds to said vertical shift register;
   (g) a clock pulse source connected to said electrode means, said source providing sensor clock pulse and vertical shift clock pulse for driving said image sensing elements and said vertical shift register by the correlated timing phase thereof in which the timing phase of said clock pulses are so arranged that an interlace scanning order and a predetermined color sub-carrier phase order of the output signal informations at the output of said vertical shift register are satisfied as like the order of a standard color television signal; and
   (h) means for supplying a clock carrier signal to said output register by which the transferred color image informations from said vertical shift register are read out due to the carrier signal frequency, said carrier signal being selected that the output signal at said output terminal has a predetermined color sub-carrier frequency equal to that of said standard color television signal.

2. A solid state color camera according to claim 1, wherein said storage register is a vertical shift register aligned parallel to the vertical direction of said image sensors by which the charged signal representing the image information sensed by said image sensor is transferred to said output register by the clock signal supplied to said electrode means.

3. A solid state color camera according to claim 2, wherein said vertical shift register is selectively used to transfer the image information sensed on both sides of said image sensing elements.

4. A solid state color camera according to claim 2, wherein four image sensing elements of said image sensor are grouped as one unit, the selected image information of which is transferred to said vertical shift register is in turn due to said predetermined sub-carrier phase order of said standard color television signal.

5. A solid state color camera according to claim 1, wherein said image sensor includes three chips of CTD imaging devices, said filter means of three primary colors being respectively disposed in the light path of each of said CTD imaging devices, and outputs of said CTD imaging devices are mixed to derive said color image signal.

6. A solid state color camera according to claim 5, wherein said CTD chips are CCD chips.

7. A solid state color camera comprising:
   (a) an image sensor which includes first and second chips of CTD imaging devices having a plurality of image sensing elements aligned both in the horizontal and vertical directions;
   (b) a storage register for storing image informations sensed by said image sensing elements;
   (c) an output register for reading out said stored image informations;
   (d) an output terminal to which the image signal from said output register is supplied;
   (e) a plurality of color filter elements corresponding to said image sensing elements, said filter elements having transmissibilities selected to pass a first primary color information and a first luminance signal information successively on said first CTD chip and a second primary color information and a second luminance signal information successively on said second CTD chip;

(f) electrode means for picking up said color informations from said image sensing elements and for transferring said color informations to said output register, said electrode means having a first group of electrodes which correspond to said image sensing elements and a second group of electrodes which corresponds to said vertical shift register; and (g) a clock pulse source connected to said electrode means, said source providing sensor clock pulse and vertical shift clock pulse for driving said image sensing elements and said vertical shift register by the correlated timing phase thereof in which the timing phase of said clock pulses are so arranged that an interlace scanning order and a predetermined color subcarrier phase order of the output signal informations at the output of said vertical shift register are satisfied as like the order of a standard color television signal.

8. A solid state color camera according to claim 7, wherein said filter elements are arranged to pass said first color and luminance signal information in opposing phase relationship on said first CTD chip as between successive horizontal rows and to pass said second color and luminance signal informations in opposing phase relationship on said second CTD chip as between successive horizontal rows in which one of said first and second color and luminance signal information derived from said first and second CTD chips is selected to establish said standard color television signal.

9. A solid state color camera according to claim 8, further comprising a circuit arrangement by which a first and a second color and luminance signal information derived from said first and second CTD chips are phase inverted at every vertical field interval so that the same plurality of filter elements corresponding to said each plurality of image sensing elements are used in common in every vertical field.

10. A solid state color camera according to claim 7, wherein said CTD is a CCD.

* * * * *